US012787242B2

(12) United States Patent
Chang et al.

(10) Patent No.: US 12,787,242 B2
(45) Date of Patent: Nov. 3, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Jui-Wen Chang, Hsinchu (TW); Feng-Ming Chang, Hsinchu (TW); Jui-Lin Chen, Taipei (TW); Lien-Jung Hung, Taipei (TW); Ping-Wei Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 275 days.

(21) Appl. No.: 18/406,778

(22) Filed: Jan. 8, 2024

(65) Prior Publication Data

US 2025/0227907 A1 Jul. 10, 2025

(51) Int. Cl.
*H10B 10/00* (2023.01)
*G11C 11/412* (2006.01)
*G11C 11/419* (2006.01)

(52) U.S. Cl.
CPC ............ *H10B 10/12* (2023.02); *G11C 11/412* (2013.01); *G11C 11/419* (2013.01)

(58) Field of Classification Search
None
See application file for complete search history.

(56) References Cited

U.S. PATENT DOCUMENTS

2025/0096076 A1* 3/2025 Chen ...................... H10B 10/12

* cited by examiner

*Primary Examiner* — Anthony Ho
(74) *Attorney, Agent, or Firm* — Ingrassia Fisher & Lorenz, LLP | IF&L

(57) ABSTRACT

A semiconductor device includes: a first memory array with a first side; a second memory array with a second side that faces the first side; and a well pickup region between the first memory array along the first side and the second memory array along the second side, the well pickup region having a first region and a second region each with an n-well tap cell and a middle region with a p-well tap cell between the first region and the second region, wherein a first edge region of the first region is placed along the first side of the first memory array region and a second edge region of the second region is placed along the second side of the second memory array region; wherein the p-well tap cell includes a contiguous OD region for providing reverse bias to P-N junctions in the first and second memory array regions.

20 Claims, 10 Drawing Sheets

SEMICONDUCTOR DEVICE AND MANUFACTURING METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
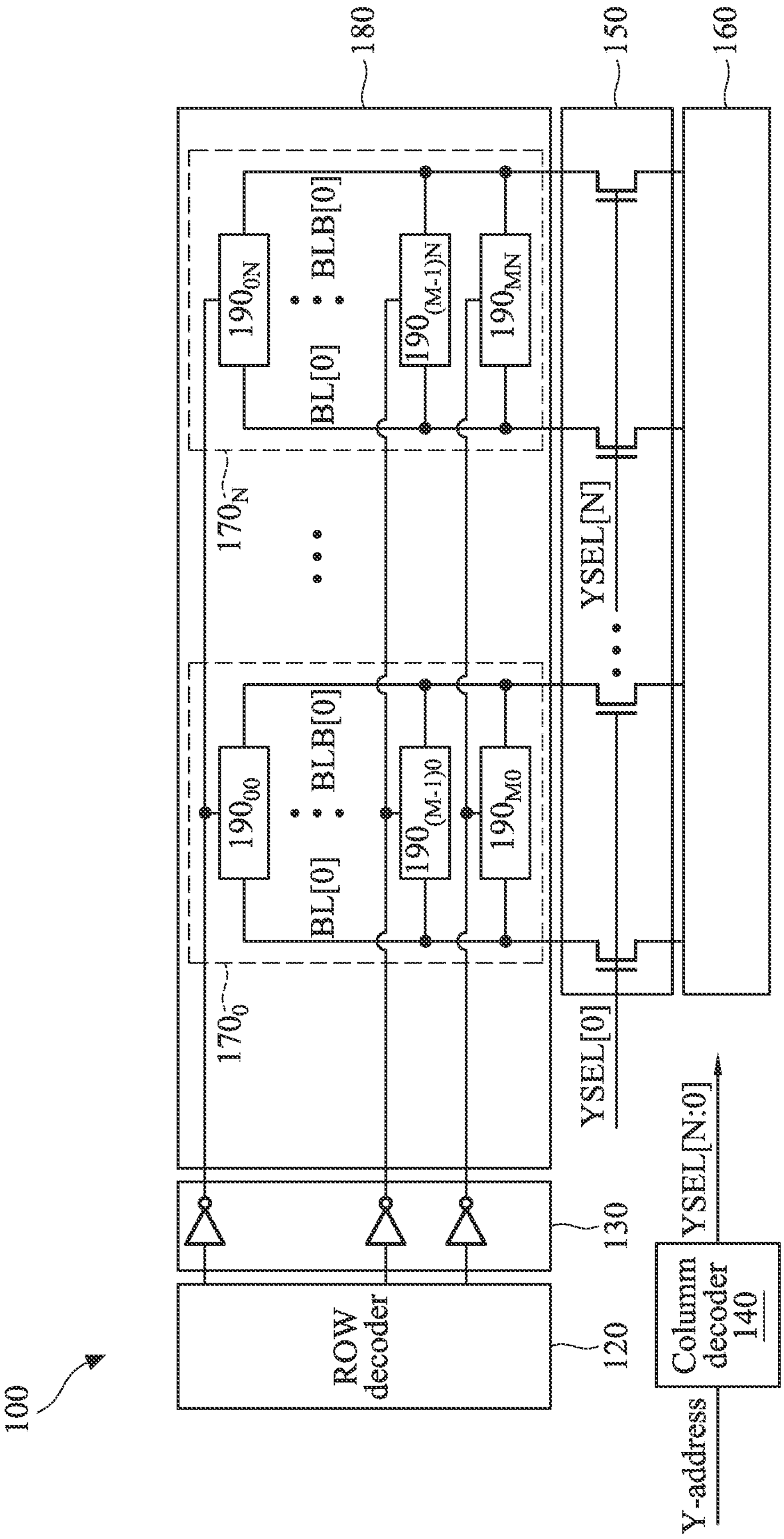
FIG. 1 is circuit schematic diagram of an example static random access memory (SRAM) device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

Features of the present disclosure can be applied to SRAM designs with CMOS (complementary metal-oxide-semiconductor) planar FET (field effect transistor) or multi-gate FET devices including double-gate FET, triple-gate FET, omega-gate FET, and gate-all-around (or surround-gate), and/or FinFET (field effect transistor with fin-like channels). Features of the present disclosure can be applied to other circuit designs such as other types of memory designs or other designs wherein a circuit element is repeated multiple times in a device.

The following disclosure describes aspects of a static random access memory (SRAM). Specifically, the disclosure describes different embodiments related to the layout of SRAM devices having multiple memory arrays. For ease of explanation, certain SRAM circuit elements and control circuits are disclosed to facilitate in the description of the different embodiments. The SRAM can also include other circuit elements and control circuits. These other circuit elements and control circuits are within the spirit and scope of this disclosure.

FIG. 1 is an illustration of an example static random access memory (SRAM) device 100, according to some embodiments of the present disclosure. The example SRAM device 100 includes a row decoder 120, a wordline driver 130, a column decoder 140, a column multiplexer (MUX) 150, a read/write circuit 160, and an SRAM array 180. SRAM array 180 includes columns of SRAM cells $\mathbf{170}_0$-$\mathbf{170}_N$.

Each of the SRAM cells in the SRAM array 180 is accessed—e.g., for memory read and memory write operations—using a memory address. Based on the memory address, the row decoder 120 selects a row of memory cells to access via the wordline driver 130. Also, based on the memory address, the column decoder 140 selects a column of memory cells $\mathbf{170}_0$-$\mathbf{170}_N$ to access via the column MUX 150. For a memory read operation, the read/write circuit 160 senses a voltage level on bitline pairs BL/BLB. For a memory write operation, the read/write circuit 160 generates voltages for bitline pairs BL/BLB in columns of the memory cells $\mathbf{170}_0$-$\mathbf{170}_N$. The notation "BL" refers to a bitline, and the notation "BLB" refers to the complement of BL. The intersection of the accessed row and the accessed column of memory cells results in access to a single memory cell.

Each of columns of memory cells $\mathbf{170}_0$-$\mathbf{170}_N$ includes memory cells 190. Memory cells 190 can be arranged in one or more arrays in SRAM device 100. In this example, a single SRAM array 180 is shown to simplify the description of the disclosed embodiments. SRAM array 180 has "M" number of rows and "N" number of columns. The notation "$\mathbf{190}_{00}$" refers to memory cell 190 located in row '0', column '0'. Similarly, the notation "$\mathbf{190}_{MN}$" refers to memory cell 190 located in row 'M', column 'N'.

The number of memory cells in an SRAM array 180 can depend on one or more design parameters of the SRAM device 100, according to some embodiments of the present disclosure. In some embodiments, the number of memory cells in an SRAM array 180 can depend on a desired bitline loading (e.g., the number of memory cells 190 electrically coupled to a BL and a BLB).

Figure 2:
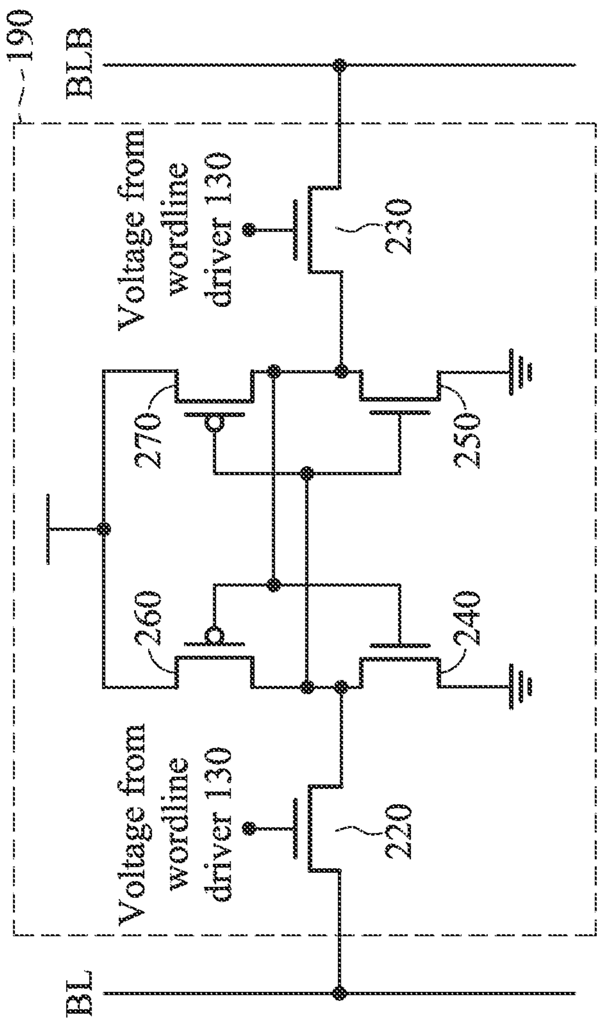
FIG. 2 is a schematic diagram of an example 6T SRAM circuit topology for a memory cell, according to some embodiments of the present disclosure.

In some embodiments, memory cell 190 can have a six transistor ("6 T") SRAM circuit topology. FIG. 2 is an illustration of an example 6T SRAM circuit topology for memory cell 190. The 6 T SRAM circuit topology includes n-type field effect transistor (NFET) pass devices 220 and 230, NFET pull-down devices 240 and 250, and p-type FET (PFET) pull-up devices 260 and 270. The FET devices (e.g., NFET devices and PFET devices) can be planar metal-oxide-semiconductor FETs, FinFETs, gate-all-around FETs, any suitable FETs, or combinations thereof. Other SRAM circuit topologies, such as four transistor ("4 T"), eight transistor ("8 T"), and ten transistor ("10 T") SRAM circuit topologies, are within the spirit and scope of the present disclosure.

A voltage from the wordline driver 130 controls NFET devices 220 and 230 to pass voltages from the bitline pair BL/BLB to a bi-stable flip-flop structure formed by NFET devices 240 and 250 and PFET devices 260 and 270. The bitline pair BL/BLB voltages can be used during a memory read operation and a memory write operation. During the memory read operation, the voltage applied by wordline driver 130 to the gate terminals of NFET pass devices 220 and 230 can be at a sufficient voltage level to pass a voltage stored in the bi-stable flip-flop structure to the BL and BLB, which can be sensed by read/write circuit 160. For example, if a '1' or a logic high value (e.g., a power supply voltage, such as 0.4 V, 0.6 V, 0.7 V, 1.0 V, 1.2 V, 1.8 V, 2.4 V, 3.3 V, 5 V, and any other suitable voltage) is passed to the BL and a '0' or a logic low value (e.g., ground or 0 V) is passed to the BLB, read/write circuit 160 can sense (or read) these values. During the memory write operation, if the BL is at a '1' or a logic high value and the BLB is at a '0' or a logic low value, the voltage applied by wordline driver 130 to the gate terminals of NFET pass devices 220 and 230 can be at a sufficient voltage level to pass the BL's logic high value and the BLB's logic low value to the bi-stable flip-flop structure. As a result, these logic values are written (or programmed) into the bi-stable flip-flop structure.

In some technologies, active regions of semiconductor devices are disposed over N-type well regions and the P-type well regions in a substrate. A p-type well region adjacent to an n-type well region may form a P-N junction. Forward bias to the P-N junction may cause a latch-up issue, and thereby damage the whole chip. To avoid this issue, tap cells are used in the SRAM structure to provide reverse bias to the P-N junction. In some SRAM structures, the tap cells are formed in the edge region of the SRAM structure.

Each SRAM array may include an edge region on different sides of the array. The edge regions may include one or more dummy SRAM cells. The arrangement of a dummy SRAM cell may be the same or similar to an SRAM cell 190. In addition, the dummy SRAM cell may not perform any circuit function. The dummy SRAM cells may have any suitable configuration and may be included for improved uniformity of fins and/or metal features. For example, each column of the SRAM array 180 may begin and end with a dummy SRAM cell. For example, each row of the SRAM array 180 may begin and end with a dummy SRAM cell. An edge region may also include n-well tap cells and p-well tap cells.

Figure 3A:
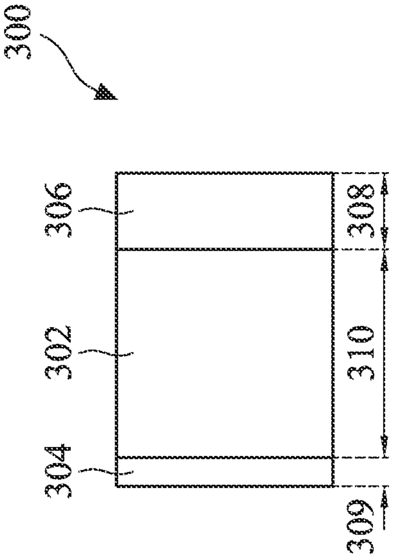
FIG. 3A is a block diagram of an example SRAM structure having a single SRAM array, according to some embodiments of the present disclosure.

FIG. 3A is a block diagram of an example SRAM structure 300. The example SRAM structure 300 includes an SRAM array 302, a first edge region 304 and a second edge region 306. The first edge region 304 may include dummy SRAM cells but not tap cells. The second edge region 306 may include n-well tap cells and p-well tap cells to provide reverse bias to the P-N junction in addition to dummy SRAM cells. In this example, the second edge region has a width 308 with a higher contacted poly pitch than the width 309 of the first edge region. In some embodiments, the SRAM array 302 can have a width 310 (e.g., in the x direction) from about 32 contacted poly pitch (CPP) to about 64 CPP. The term "contacted poly pitch (CPP)" can refer to a transistor's gate pitch in layout, wherein the gate pitch can depend on a semiconductor process technology node implemented to manufacture the transistors. The semiconductor process technology node can include a 16 nm technology node, a 14 nm technology node, a 10 nm technology node, a 7 nm technology node, a 5 nm technology node, a 3 nm technology node, a 2 nm technology node, a 1 nm technology node, and smaller technology nodes.

To increase the number of memory cells in an SRAM device, an SRAM array may be mirrored. This can result in a duplication of the edge cells and increased IC real-estate devoted to the edge regions. In accordance with embodiments of the present disclosure, a middle strap design is utilized to provide an edge region between two mirrored SRAM arrays that is smaller than two edge regions with strap cells for two SRAM arrays were employed.

Figure 3B:
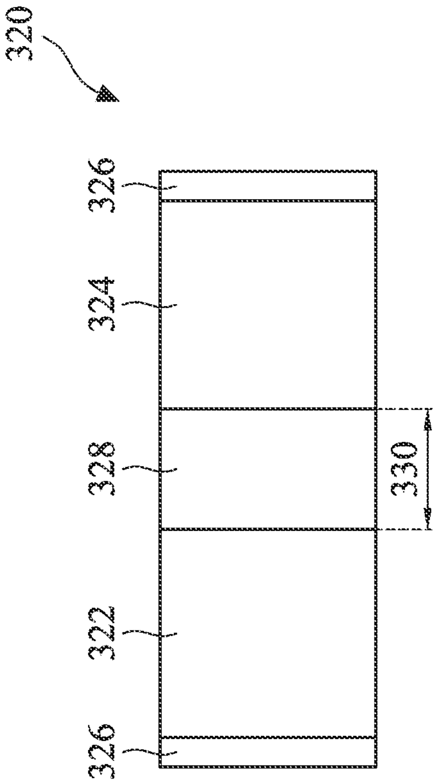
FIG. 3B is a block diagram depicting an example SRAM structure having two SRAM arrays, according to some embodiments of the present disclosure.

FIG. 3B is a block diagram depicting an example SRAM structure 320. The example SRAM structure 320 includes a first SRAM array 322, a second SRAM array 324, two first edge regions 326, and a middle strap region 328. The first edge regions 326 may include dummy SRAM cells but not tap cells. The middle strap region 328 includes n-well tap cells and p-well tap cells to provide reverse bias to the P-N junction. In this example, the middle strap region 328 has a width 330 that is not as wide as the width of two second edge regions 306 (e.g., 2× width 308). In some embodiments the width 330 can be 15% less than the width of two second edge regions 306 (e.g., 2× width 308). In some embodiments, use of the middle strap region 328 can result in an area savings of around 1% in the SRAM design.

Figure 4:
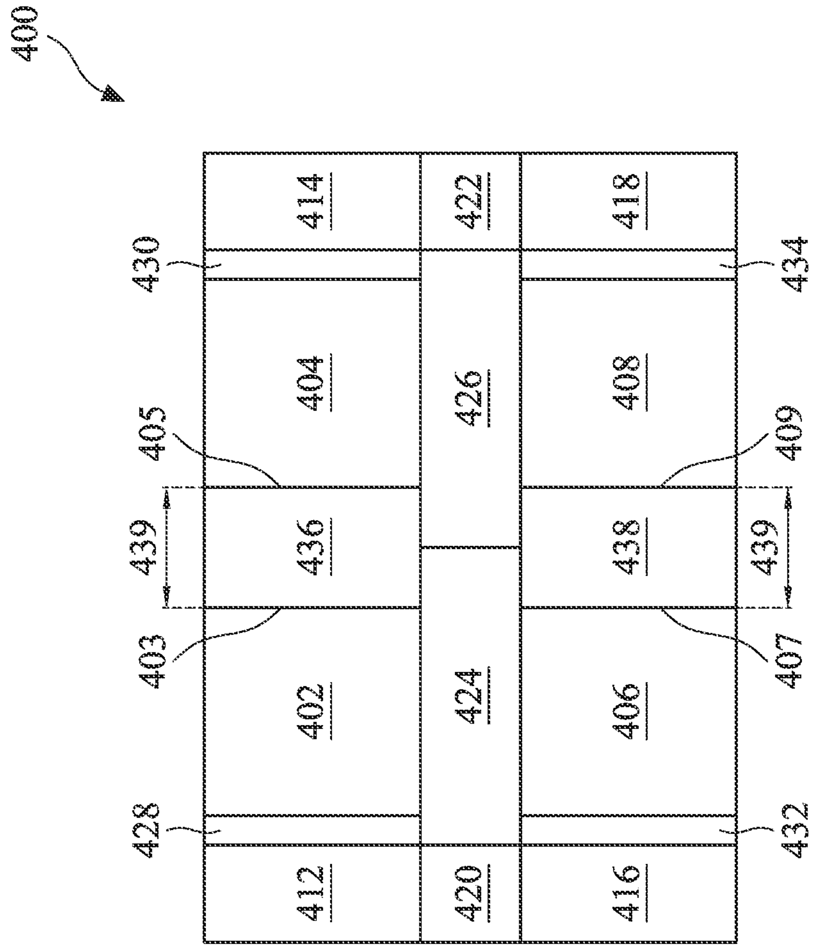
FIG. 4 is a block diagram depicting an example SRAM structure having four SRAM arrays, according to some embodiments of the present disclosure.

FIG. 4 is a layout floor plan of an example SRAM structure 400, in accordance with various embodiments. The example SRAM structure 400 includes a first SRAM array 402, a second SRAM array 404, a third SRAM array 406, and a fourth SRAM array 408. The example SRAM structure 400 further includes a first input/output (I/O) region 412 for providing I/O for the first SRAM array 402, a second I/O region 414 for providing I/O for the second SRAM array 404, a third I/O region 416 for providing I/O for the third SRAM array 406, and a fourth I/O region 418 for providing I/O for the fourth SRAM array 408. The example SRAM structure 400 also includes a first control region 420 for providing control functions (e.g., column decode and row decode) for the first SRAM array 402 and the third SRAM array 406, and a second control region 422 for providing control functions for the second SRAM array 404 and the fourth SRAM array 408. The example SRAM structure 400 includes a first word line (WL) driver region 424 for driving WLs in the first SRAM array 402 and the third SRAM array 406. The example SRAM structure 400 includes a second WL driver region 426 for driving WLs in the second SRAM array 404 and the fourth SRAM array 408.

The first SRAM array 402 includes a tapless edge region 428 on one side that may include dummy SRAM cells but not tap cells. The second SRAM array 404 includes a tapless edge region 430 on one side that may include dummy SRAM cells but not tap cells. The third SRAM array 406 includes a tapless edge region 432 on one side that may include dummy SRAM cells but not tap cells. The fourth SRAM array 408 includes a tapless edge region 434 on one side that may include dummy SRAM cells but not tap cells. In some embodiments, the edge regions without tap cells (tapless edge regions 428, 430, 432, 434) can have a width (in the X-direction) of 4 CPP.

Instead of including a separate edge region on the other side for each of the SRAM arrays, the first SRAM array 402 and the second SRAM array 404 share a middle strap edge region 436 disposed between the first SRAM array 402 at a side 403 and the second SRAM array 404 at a side 405, and the third SRAM array 406 and the fourth SRAM array 408 share a middle strap edge region 438 disposed between the third SRAM array 406 at a side 407 and the fourth SRAM array 408 at a side 409.

The middle strap edge region 436 and the middle strap edge region 438 each may include n-well tap cells and p-well tap cells. In this example, each of the middle strap edge region 436 and the middle strap edge region 438 has a width 439 that is not as wide as the width 308 of two second edge regions 306. Use of the middle strap edge region 436 can result in integrated circuit area savings versus using a separate edge region with tap cells for each of the first SRAM array 402 and the second SRAM array 404. Similarly, use of the middle strap edge region 438 can result in integrated circuit area savings versus using a separate edge region with tap cells for each of the third SRAM array 406 and the fourth SRAM array 408. In some embodiments the width 439 can be 15% less than the width of two second edge regions 306 (e.g., 2× width 308). In some embodiments, use of the middle strap edge region 436 and/or middle strap edge region 438 can result in an area savings of around 1% in an SRAM design.

In some embodiments, the layout floorplan can represent a portion of a larger layout floorplan, such as a floorplan of an entire chip or system design. The example SRAM structure 400 may be an intermediate device fabricated during processing of an integrated circuit (IC), or a portion thereof, that may include passive components such as resistors, capacitors, and inductors, and active components such as P-type FETs (PFETs), N-type FETs (NFETs), metal-oxide semiconductor field effect transistors (MOSFET), complementary metal-oxide semiconductor (CMOS) transistors, bipolar transistors, high voltage transistors, high frequency transistors, and/or other memory cells. It is understood that the present disclosure can be applied to an SRAM structure including a FinFET transistor, nanostructure transistor (also called as a nanosheet device, a nanowire device, a nanoring device, a gate-surrounding device, a gate-all-around (GAA) device, or a multi-bridge-channel (MBC) device). The present disclosure is not limited to any particular number of devices or device regions, or to any particular device configurations.

Figure 5:
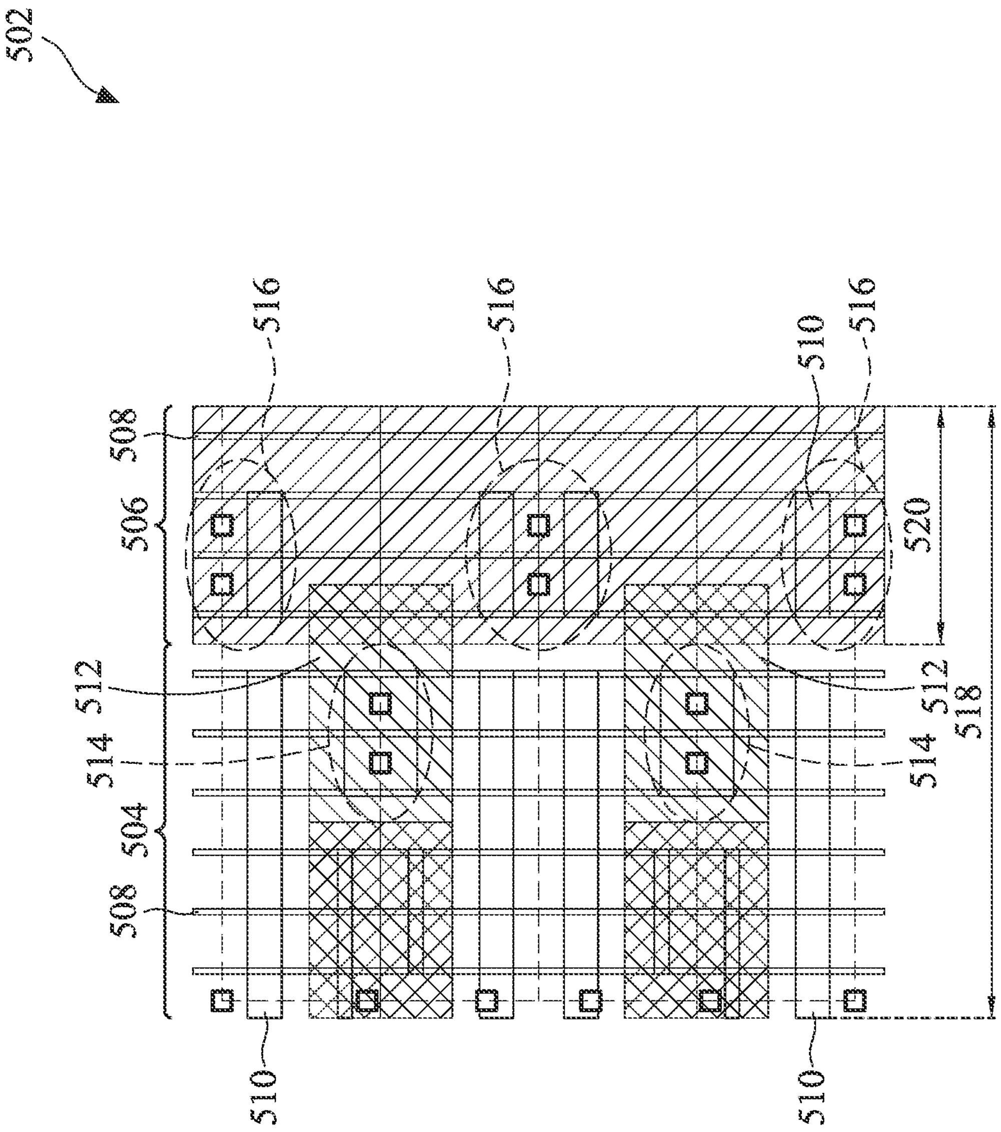
FIG. 5 is a layout drawing depicting an example layout for an SRAM edge region for use with a single SRAM array, according to some embodiments of the present disclosure.

FIG. 5 is a layout drawing depicting an example layout for an edge region 502 with tap cells that can be used with a SRAM array. The example edge region 502 includes a first region 504 and a second region 506, both with poly silicon (PO) regions 508 and OD areas 510. FinFET NMOS and PMOS transistors are formed in oxide definition (OD) areas. An OD area, sometimes labeled as an "oxide diffusion" area, typically defines an active area for a transistor, i.e., the area where the source, drain and channel under the gate of transistor are formed. Although the OD areas 510 are not used for transistors in the edge region 502, the OD areas 510 are formed from the same material used for the OD areas of transistors in the SRAM arrays. The first region 504 also includes a plurality of n-wells 512 and n-well tap cells 514. The second region 506 comprises a p+ implantation region and a plurality of p-well tap cells 516. The example edge region 502 has a width 518 of about 10 CPP which increases the geometry size of the SRAM structure, wherein CPP is the contacted poly pitch which is defined as the pitch distance between adjacent gate structures, and the example second region 506 has a width 520 of about 4 CPP.

Figure 6:
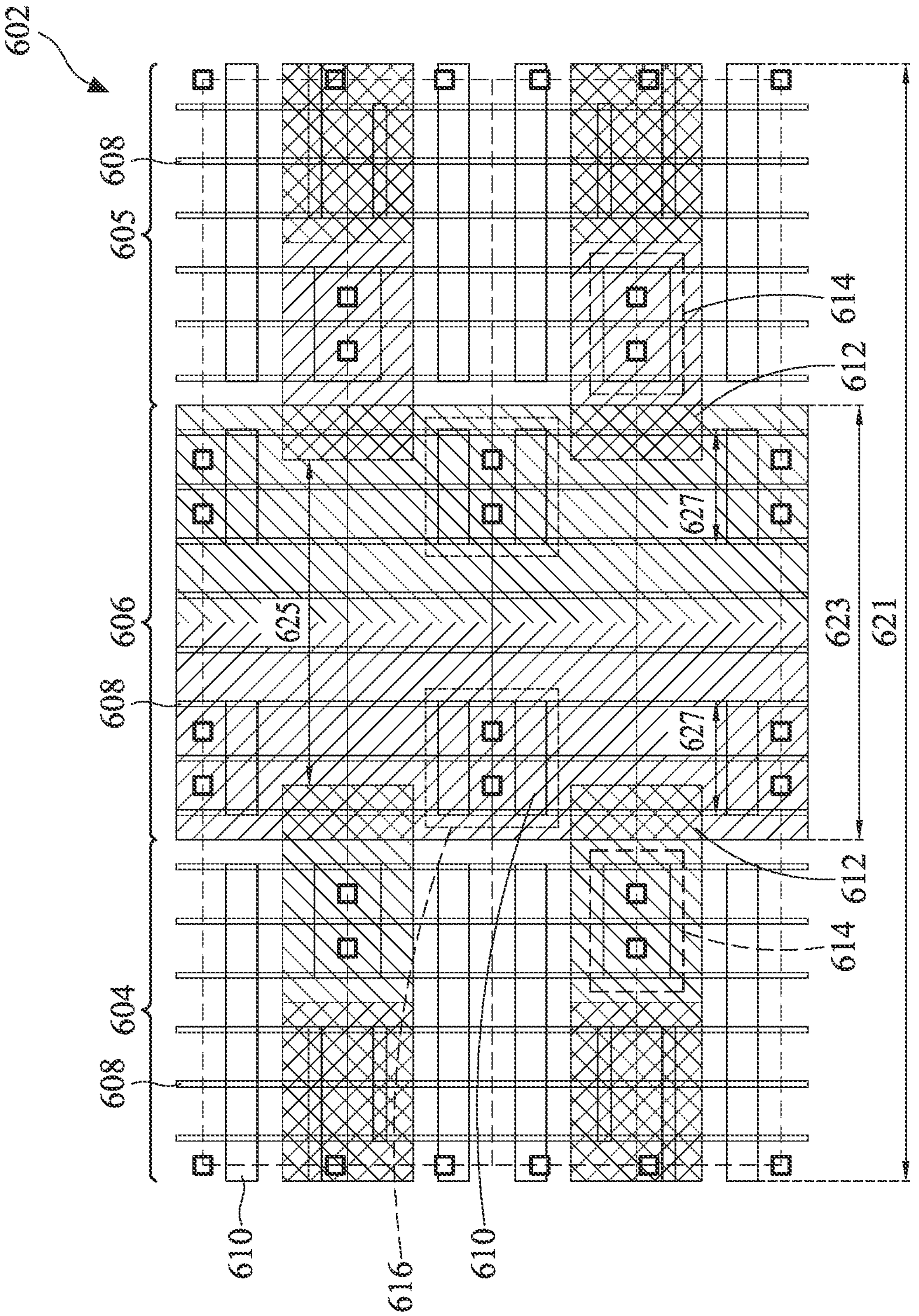
FIG. 6 is a layout drawing depicting an example layout for an SRAM edge region for an SRAM structure having two SRAM arrays, according to some embodiments of the present disclosure.

FIG. 6 is a layout drawing depicting an example layout for an edge region 602 for two SRAM arrays that are in a layout adjacent to each other that uses two adjacent edge regions (such as two edge regions 502). The example edge region 602 includes a first region 604, a second region 605, and a middle region 606, all with poly silicon (PO) regions 608 and OD areas 610. The first region 604 and the second region 605 also include a plurality of n-wells 612 and n-well tap cells 614. The middle region 606 comprises a p+ implantation region and a plurality of p-well tap cells 616. The example edge region 602 has a width 621 of about 20 CPP, and the example middle region 606 has a width 623 of about 8 CPP. The space 625 between the N-wells 612 is about 6 CPP and the length 627 of the OD regions of the plurality of p-well tap cells 616 in the middle region 606 is about 2 CPP.

Figure 7:
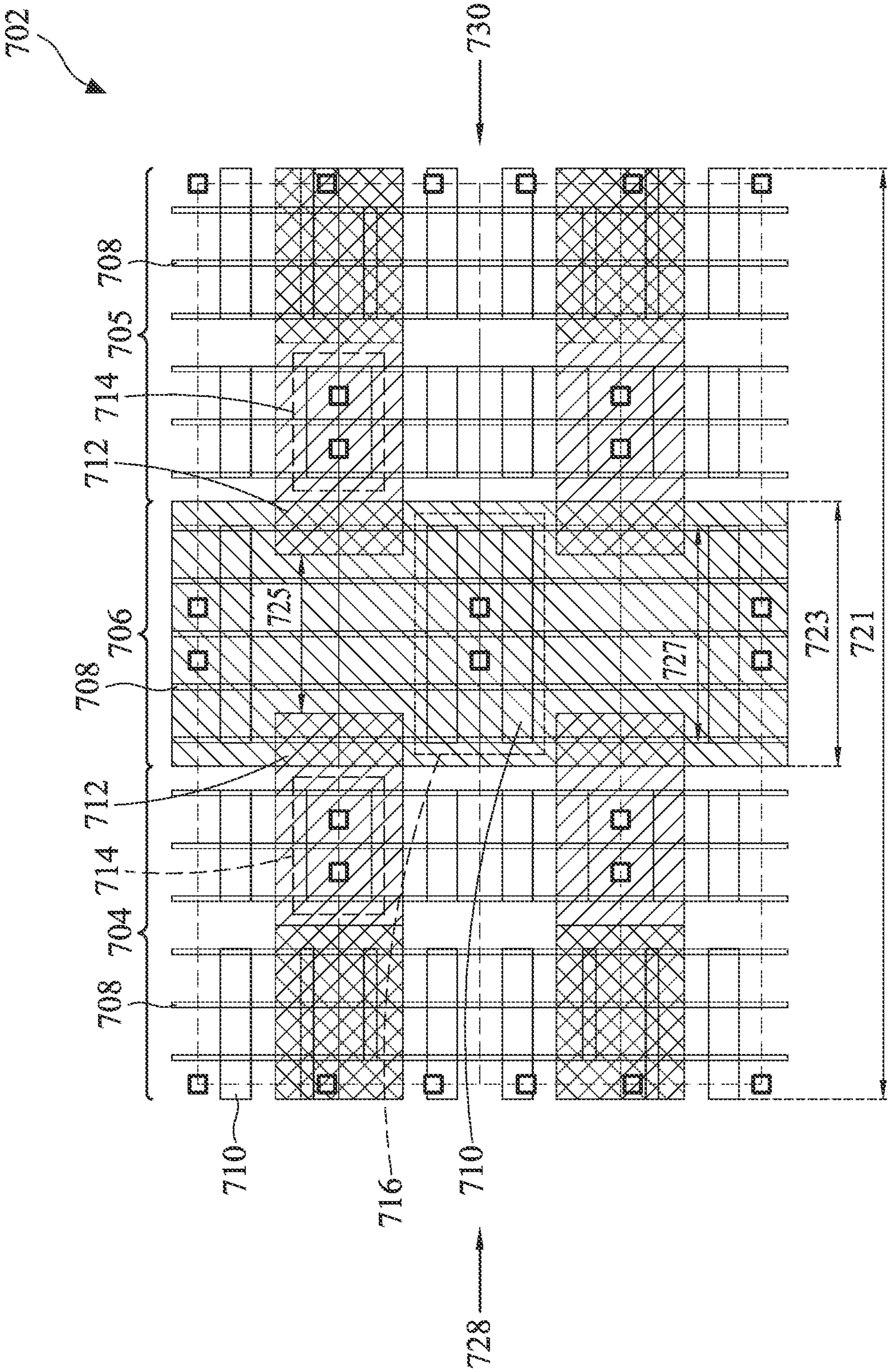
FIG. 7 is a layout drawing depicting an example layout for an example middle strap region for use with an SRAM structure having two SRAM arrays, according to some embodiments of the present disclosure.

FIG. 7 is a layout drawing depicting an example layout for an edge region 702 for two SRAM arrays that are in a layout adjacent to each other, in accordance with various embodiments. The example edge region 702 includes a first region 704, a second region 705, and a middle strap region 706, all with poly silicon (PO) regions 708 and OD areas 710. The first region 704 and the second region 705 also include a plurality of n-wells 712 and n-well tap cells 714. The first region 704 includes a first edge 728 and the second region 705 includes a second edge 730. The middle strap region 706 comprises a p+ implantation region and a plurality of p-well tap cells 716. The example edge region 702 has a width 721 of about 17 CPP, which is narrower than the width 621, and the example middle strap region 706 has a width 723 of about 5 CPP, which is narrower than the width 623. This results in the edge region 702 taking up less area than the edge region 602 in an integrated circuit. The space 725 between the N-wells 712 is about 3 CPP and the length 727 of the contiguous OD region 710 of the plurality of p-well tap cells 716 in the middle strap region 706 is about 4 CPP. The plurality of p-well tap cells 716 can be used for SRAM arrays on both sides of the edge region 702.

Figure 8:
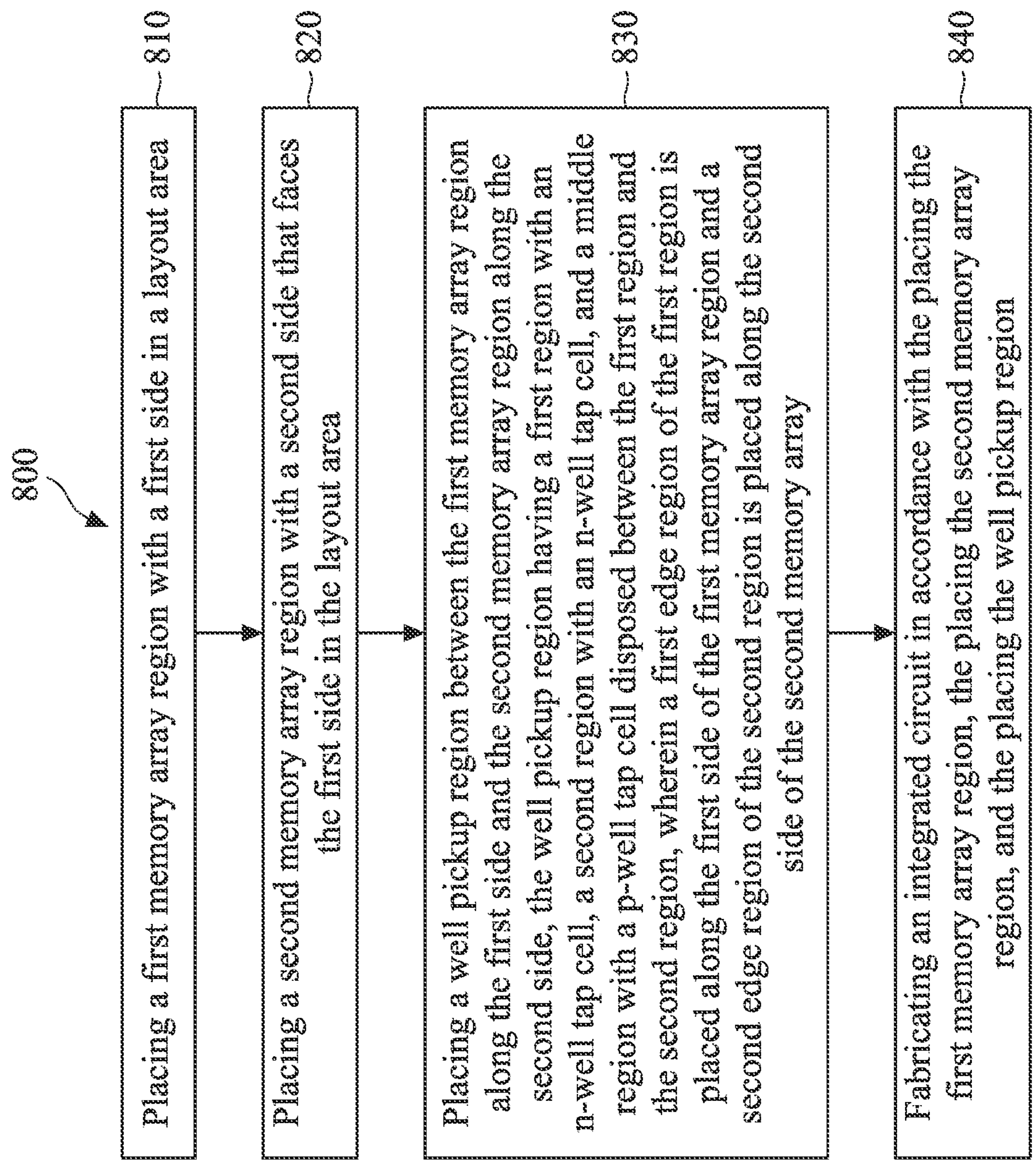
FIG. 8 is a flowchart of an example method for memory cell placement, according to some embodiments of the present disclosure.

FIG. 8 is a flowchart of an example method 800 for memory cell placement. FIGS. 4 and 7 are cross referenced to provide example embodiments after completion of various blocks of the example method 800.

At block 810, the example method 800 includes placing a first memory array region with a first side in a layout area. With reference to FIG. 4 in an example implementation, a first SRAM array 402 may be placed with a first side 403.

At block 820, the example method 800 includes placing a second memory array region with a second side that faces the first side in the layout area. With reference to FIG. 4 in an example implementation, a second SRAM array 404 may be placed with a second side 405 that faces the first side 403.

At block 830, the example method 800 includes placing a well pickup region between the first memory array region along the first side and the second memory array region along the second side. The well pickup region may include a first region with an n-well tap cell, a second region with an n-well tap cell, and a middle region with a p-well tap cell disposed between the first region and the second region, wherein a first edge region of the first region is placed along the first side of the first memory array region and a second edge region of the second region is placed along the second side of the second memory array.

With reference to FIGS. 4 and 7 in an example implementation, a well pickup region (e.g., middle strap edge region 436, edge region 702) is placed between the first memory array region (first SRAM array 402) along the first side (first side 403) and the second memory array region (second SRAM array 404) along the second side (side 405). The well pickup region (middle strap edge region 436, edge region 702) may include a first region (first region 704) with an n-well tap cell (n-well tap cells 714), a second region (second region 705) with an n-well tap cell (n-well tap cells 714), and a middle region (middle strap region 706) with a p-well tap cell (plurality of p-well tap cells 716) disposed between the first region (first region 704) and the second region (second region 705), wherein a first edge (first edge 728) of the first region (first region 704) is placed along the first side (first side 403) of the first memory array region (first SRAM array 402) and a second edge (second edge 730) of the second region (second region 705) is placed along the second side (side 405) of the second memory array region (second SRAM array 404).

In various embodiments, the well pickup region (middle strap edge region 436, edge region 702) has a width of about M*2-3 poly pitch, wherein M is the poly pitch width for an edge region (edge region 502) with an n-well tap cell (n-well tap cell 514) and a p-well tap cell (p-well tap cell 516) for a memory array region that is not placed adjacent to another memory array region.

In various embodiments, the p-well tap cell (p-well tap cell 716) comprises a contiguous OD region (OD areas 710) that is configured to provide reverse bias to a P-N junction in the first memory array and a different P-N junction in the second memory array.

In various embodiments, a distance (space 725) between an n-well (n-well 712) in the first region (first region 704) and a different n-well (n-well 712) in the second region (second region 705) has about a 3 poly pitch width.

In various embodiments, the middle region (middle strap region 706) has about a 5 poly pitch width.

In various embodiments, a first tapless edge region (tapless edge region 428) is placed along a first opposite edge of the first memory array region (first SRAM array 402) that is on a side opposite the first side (first side 403) of the first memory array region, wherein the first tapless edge (tapless edge region 428) does not include an n-well tap cell or a p-well tap cell.

In various embodiments, a second tapless edge region (tapless edge region 430) is placed along a second opposite edge of the second memory array region (second SRAM array 404) that is on a side opposite the second side (side 405) of the second memory array, wherein the second tapless edge (tapless edge region 430) does not include an n-well tap cell or a p-well tap cell.

In various embodiments, placing the first memory array region (first SRAM array 402) and placing the second memory array region (second SRAM array 404) comprises inserting a plurality of SRAM cells (memory cell 190) in the layout area.

In various embodiments, inserting the plurality of SRAM cells (memory cell 190) in the layout area comprises inserting a plurality of gate all-around field effect transistors in a 6 transistor SRAM circuit topology.

At block 840, the example method 800 includes fabricating an integrated circuit in accordance with the placing the first memory array region, the placing the second memory array region, and the placing the well pickup region.

Figure 9:
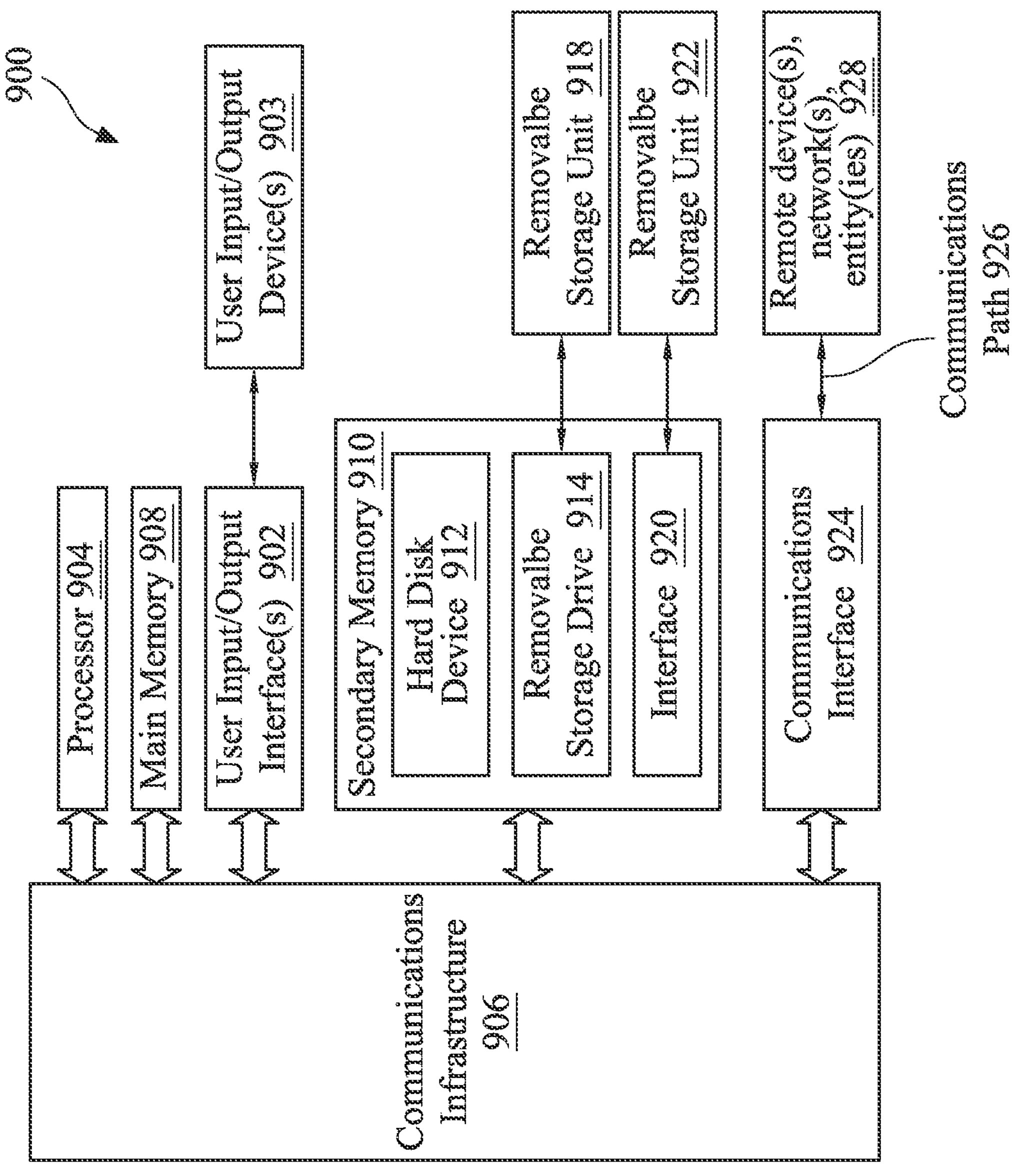
FIG. 9 is a block diagram of an example computer system in which various embodiments of the present disclosure can be implemented, according to some embodiments of the present disclosure.

FIG. 9 is an illustration of an example computer system 900 in which various embodiments of the present disclosure can be implemented, according to some embodiments. The example computer system 900 is configured by programming instructions to perform the functions and operations described herein. For example, and without limitation, the computer system 900 is configured to place memory cells in an IC layout design using, for example, an EDA tool. The example computer system 900 is configured to execute one or more operations in method 800, which describes an example method for placing memory cells in a layout area.

Computer system 900 includes one or more processors (also called central processing units, or CPUs), such as a processor 904. Processor 904 is connected to a communication infrastructure or bus 906. Computer system 900 also includes input/output device(s) 903, such as monitors, keyboards, pointing devices, etc., that communicate with communication infrastructure or bus 906 through input/output interface(s) 902. An EDA tool can receive instructions to implement functions and operations described herein—e.g., method 800 of FIG. 8—via input/output device(s) 903. Computer system 900 also includes a main or primary memory 908, such as random access memory (RAM). Main memory 908 can include one or more levels of cache. Main memory 908 has stored therein control logic (e.g., computer software) and/or data. In some embodiments, the control logic (e.g., computer software) and/or data can include one or more of the operations described above with respect to method 800 of FIG. 8.

Computer system 900 can also include one or more secondary storage devices or memory 910. Secondary memory 910 can include, for example, a hard disk drive 912 and/or a removable storage device or drive 914. Removable storage drive 914 can be a floppy disk drive, a magnetic tape drive, a compact disk drive, an optical storage device, tape backup device, and/or any other storage device/drive.

Removable storage drive 914 can interact with a removable storage unit 918. Removable storage unit 918 includes a computer usable or readable storage device having stored thereon computer software (control logic) and/or data. Removable storage unit 918 can be a floppy disk, magnetic tape, compact disk, DVD, optical storage disk, and/or any other computer data storage device. Removable storage drive 914 reads from and/or writes to removable storage unit 918 in a well-known manner.

In some embodiments, secondary memory 910 can include other means, instrumentalities, or other approaches for allowing computer programs and/or other instructions and/or data to be accessed by computer system 900. Such means, instrumentalities or other approaches can include, for example, a removable storage unit 922 and an interface 920. Examples of the removable storage unit 922 and the interface 920 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 910, removable storage unit 918, and/or removable storage unit 922 can include one or more of the operations described above with respect to method 800 of FIG. 8.

Computer system 900 can further include a communication or network interface 924. Communication interface 924 enables computer system 900 to communicate and interact with any combination of remote devices, remote networks, remote entities, etc. (individually and collectively referenced by reference number 928). For example, communication interface 924 can allow computer system 900 to communicate with remote devices 928 over communications path 926, which can be wired and/or wireless, and which can include any combination of LANs, WANs, the Internet, etc. Control logic and/or data can be transmitted to and from computer system 900 via communication path 926.

In various embodiments, the processor 904 of example computer system 900, when executing programming instructions stored in memory 908, is configured to perform operations including: placing a first memory array region with a first side in a layout area; placing a second memory array region with a second side that faces the first side in the layout area; placing a well pickup region between the first memory array region along the first side and the second memory array region along the second side, the well pickup region having a first region with an n-well tap cell, a second region with an n-well tap cell, and a middle region with a p-well tap cell disposed between the first region and the second region, wherein a first edge region of the first region is placed along the first side of the first memory array region and a second edge region of the second region is placed along the second side of the second memory array region; completing, for fabrication, a layout of an integrated circuit that includes the first memory array region, the second memory array region, and the well pickup region; generating, for fabrication, an IC design layout diagram of an integrated circuit from the layout that includes the first memory array region, the second memory array region, and the well pickup region; and providing the IC design layout diagram as a tangible output for use to fabricate an IC that includes the first memory array region, the second memory array region, and the well pickup region. In various embodiments, the IC design layout diagram can be expressed in a GDSII file format or DFII file format.

In various embodiments, the p-well tap cell includes a contiguous OD region that is configured to provide reverse bias to a P-N junction in the first memory array region and a different P-N junction in the second memory array region. In various embodiments, the well pickup region has a width of about M*2-3 poly pitch, wherein M is a poly pitch width for an edge region with an n-well tap cell and a p-well tap cell for a memory array region that is not placed adjacent to another memory array region. In various embodiments, a distance between an n-well in the first region and a different n-well in the second region has about a 3 poly pitch width. In various embodiments, the middle region has about a 5 poly pitch width.

In various embodiments, the processor 904 of example computer system 900, when executing programming instructions stored in memory 908, is further configured to perform operations including placing a first tapless edge region along a first opposite edge of the first memory array region that is on a side opposite the first side of the first memory array region, wherein the first tapless edge region does not include an n-well tap cell or a p-well tap cell. In various embodiments, the processor 904 of example computer system 900, when executing programming instructions stored in memory 908, is further configured to perform operations including placing a second tapless edge region along a second opposite edge of the second memory array region that is on a side opposite the second side of the second memory array region, wherein the second tapless edge region does not include an n-well tap cell or a p-well tap cell.

In various embodiments, placing the first memory array region and placing the second memory array region includes inserting a plurality of static random access memory (SRAM) cells in the layout area. In various embodiments, inserting the plurality of SRAM cells in the layout area includes inserting a plurality of gate all-around field effect transistors in a 6 transistor SRAM circuit topology.

The operations in the preceding embodiments can be implemented in a wide variety of configurations and architectures. Therefore, some or all of the operations in the preceding embodiments—e.g., method 800 of FIG. 8—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 900, main memory 908, secondary memory 910 and removable storage units 918 and 922, as well as tangible articles of manufacture embodying any combination of the foregoing. Such control logic, when executed by one or more data processing devices (such as computer system 900), causes such data processing devices to operate as described herein.

Figure 10:
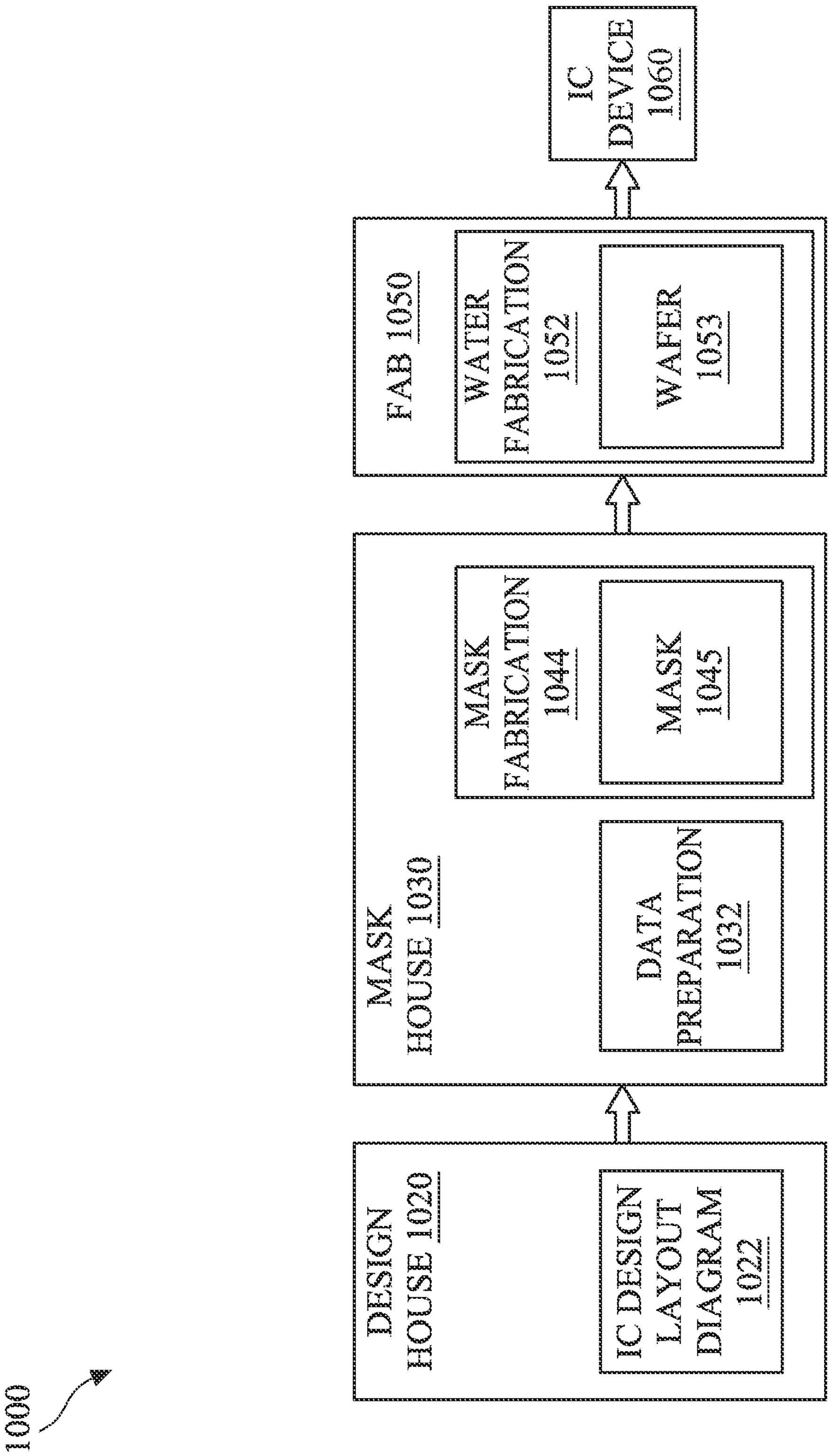
FIG. 10 is a block diagram of an IC manufacturing system and associated IC manufacturing flow, according to some embodiments of the present disclosure.

FIG. 10 is an illustration of an example IC manufacturing system 1000 and associated example IC manufacturing flow, according to some embodiments. In some embodiments, the layouts described herein—e.g., layout floorplan of FIG. 4 and associated layout floorplans and circuit structures—can be fabricated using IC manufacturing system 1000.

IC manufacturing system 1000 includes a design house 1020, a mask house 1030, and an IC manufacturer/fabricator ("fab") 1050—each of which interacts with one another in the design, development, and manufacturing cycles and/or services related to manufacturing an IC device 1060. Design house 1020, mask house 1030, and fab 1050 are connected by a communications network. In some embodiments, the communications network is a single network. In some embodiments, the communications network is a variety of different networks, such as an intranet and the Internet. The communications network includes wired and/or wireless communication channels. Each of design house 1020, mask house 1030, and fab 1050 interacts with one another and provides services to and/or receives services from one another. In some embodiments, two or more of design house 1020, mask house 1030, and fab 1050 coexist in a common facility and use common resources.

Design house 1020 generates an IC design layout diagram 1022. IC design layout diagram 1022 includes various geometrical patterns, such as those associated with layout floorplan of FIG. 4 and associated layout floorplans and circuit structures. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, a gate electrode, a source and drain, and conductive segments or vias of an interlayer interconnection, to be formed in a semiconductor substrate (e.g., a silicon wafer) and various material layers disposed on the semiconductor substrate. Design house 1020 implements a proper design procedure to form IC design layout diagram 1022. The design procedure includes one or more of logic design, physical design, and place and route design. IC design layout diagram 1022 can be presented in one or more data files with information on the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer that converts the RDF to an image on a substrate, such as a mask (or reticle) 1045 or a semiconductor wafer 1053. IC design layout diagram 1022 can be manipulated by mask data preparation 1032 to comply with particular characteristics of the mask writer and/or requirements of fab 1050. In FIG. 10, data preparation 1032 and mask fabrication 1044 are illustrated as separate elements. In some embodiments, data preparation 1032 and mask fabrication 1044 can be collectively referred to as "mask data preparation."

In some embodiments, data preparation 1032 includes optical proximity correction (OPC), which uses lithography enhancement techniques to compensate for image errors, such as those that can arise from diffraction, interference, and other process effects. OPC adjusts IC design layout diagram 1022. In some embodiments, data preparation 1032 includes further resolution enhancement techniques (RET), such as off-axis illumination, sub-resolution assist features, phase-shifting masks, other suitable techniques, and combinations thereof. In some embodiments, inverse lithography technology (ILT) can be used, which treats OPC as an inverse imaging problem.

In some embodiments, data preparation 1032 includes a mask rule checker (MRC) that checks whether IC design layout diagram 1022 has undergone OPC with a set of mask creation rules that include geometric and/or connectivity restrictions to ensure sufficient margins, to account for variability in semiconductor manufacturing processes. In some embodiments, the MRC modifies IC design layout diagram 1022 to compensate for limitations during mask fabrication 1044, which may undo part of the modifications performed by OPC to meet mask creation rules.

In some embodiments, data preparation 1032 includes lithography process checking (LPC) that simulates processing that will be implemented by fab 1050 to fabricate IC device 1060. LPC simulates this processing based on IC design layout diagram 1022 to create a simulated manufactured device, such as IC device 1060. The processing parameters in the LPC simulation can include parameters associated with various processes of the IC manufacturing cycle, parameters associated with tools used for IC manufacturing, and/or other aspects of the manufacturing process. LPC takes into account various factors, such as aerial image contrast, depth of focus (DOF), mask error enhancement factor (MEEF), and other suitable factors. In some embodiments, after a simulated manufactured device has been created by LPC and if the simulated device does not satisfy design rules, OPC and/or MRC are be repeated to further refine IC design layout diagram 1022.

In some embodiments, data preparation 1032 includes additional features, such as a logic operation (LOP) to modify IC design layout diagram 1022 based on manufacturing rules. Additionally, the processes applied to IC design layout diagram 1022 during data preparation 1032 may be executed in a different order than described above.

After data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams are used to form a pattern on a mask (photomask or reticle) 1045 based on the modified IC design layout diagram 1022.

Mask 1045 can be formed by various technologies. In some embodiments, mask 1045 is formed using binary technology. In some embodiments, a mask pattern includes opaque regions and transparent regions. A radiation beam, such as an ultraviolet (UV) beam, can be used to expose the image sensitive material layer (e.g., photoresist) coated on a wafer. The radiation beam is blocked by the opaque region and transmits through the transparent regions. For example, a binary mask version of mask 1045 includes a transparent substrate (e.g., fused quartz) and an opaque material (e.g., chromium) coated in the opaque regions of the binary mask.

In some embodiments, mask 1045 is formed using a phase shift technology. In a phase shift mask (PSM) version of mask 1045, various features in the pattern formed on the phase shift mask are configured to have proper phase difference to enhance the resolution and imaging quality. For example, the phase shift mask can be attenuated PSM or alternating PSM.

The mask generated by mask fabrication 1044 is used in a variety of processes. For example, the mask can be used in an ion implantation process to form various doped regions in semiconductor wafer 1053, in an etching process to form various etching regions in semiconductor wafer 1053, and/or in other suitable processes.

Fab 1050 includes wafer fabrication 1052. Fab 1050 can include one or more manufacturing facilities for the fabrication of a variety of different IC products. In some embodiments, fab 1050 is a semiconductor foundry. For example, there may be a manufacturing facility for front-end fabrication of IC products (front-end-of-line (FEOL) fabrication), a second manufacturing facility to provide back end fabrication for the interconnection and packaging of the IC products (back-end-of-line (BEOL) fabrication), and a third manufacturing facility to provide other services for the foundry business.

Fab 1050 uses mask 1045 fabricated by mask house 1030 to fabricate IC device 1060. In some embodiments, semiconductor wafer 1053 is fabricated by fab 1050 using mask 1045 to form IC device 1060. In some embodiments, the IC fabrication includes performing one or more lithographic exposures based on IC design layout diagram 1022. Semiconductor wafer 1053 includes a silicon substrate or other appropriate substrate with material layers formed thereon. Semiconductor wafer 1053 further includes doped regions, dielectric features, multilevel interconnects, and other suitable features.

In some aspects, the techniques described herein relate to a method for memory cell placement, including: placing a first memory array region with a first side in a layout area; placing a second memory array region with a second side that faces the first side in the layout area; placing a well pickup region between the first memory array region along the first side and the second memory array region along the second side, the well pickup region having a first region with an n-well tap cell, a second region with an n-well tap cell, and a middle region with a p-well tap cell disposed between the first region and the second region, wherein a first edge region of the first region is placed along the first side of the first memory array region and a second edge region of the second region is placed along the second side of the second memory array region; and fabricating an integrated circuit in accordance with the placing the first memory array region, the placing the second memory array region, and the placing the well pickup region; wherein the well pickup region has a width of about M*2-3 poly pitch, wherein M is a poly pitch width for an edge region with an n-well tap cell and a p-well tap cell for a memory array region that is not placed adjacent to another memory array region; and wherein placing the first memory array region, placing the second memory array region, and placing the well pickup region are performed by one or more processors.

In some aspects, the techniques described herein relate to a method, wherein: the p-well tap cell includes a contiguous OD region that is configured to provide reverse bias to a P-N junction in the first memory array region and a different P-N junction in the second memory array region.

In some aspects, the techniques described herein relate to a method, wherein: a distance between an n-well in the first region and a different n-well in the second region has about a 3 poly pitch width.

In some aspects, the techniques described herein relate to a method, wherein: the middle region has about a 5 poly pitch width.

In some aspects, the techniques described herein relate to a method, further including placing a first tapless edge region along a first opposite edge of the first memory array region that is on a side opposite the first side of the first memory array region, wherein the first tapless edge region does not include an n-well tap cell or a p-well tap cell.

In some aspects, the techniques described herein relate to a method, further including placing a second tapless edge region along a second opposite edge of the second memory array region that is on a side opposite the second side of the second memory array region, wherein the second tapless edge region does not include an n-well tap cell or a p-well tap cell.

In some aspects, the techniques described herein relate to a method, wherein placing the first memory array region and placing the second memory array region includes inserting a plurality of static random access memory (SRAM) cells in the layout area.

In some aspects, the techniques described herein relate to a method, wherein inserting the plurality of SRAM cells in the layout area includes inserting a plurality of gate all-around field effect transistors in a 6 transistor SRAM circuit topology.

In some aspects, the techniques described herein relate to a computer system, including: a memory configured to store instructions; and a processor that, when executing the instructions, is configured to perform operations including: placing a first memory array region with a first side in a layout area; placing a second memory array region with a second side that faces the first side in the layout area; placing a well pickup region between the first memory array region along the first side and the second memory array region along the second side, the well pickup region having a first region with an n-well tap cell, a second region with an n-well tap cell, and a middle region with a p-well tap cell disposed between the first region and the second region, wherein a first edge region of the first region is placed along the first side of the first memory array region and a second edge region of the second region is placed along the second side of the second memory array region; and completing, for fabrication, a layout of an integrated circuit that includes the first memory array region, the second memory array region, and the well pickup region; wherein the p-well tap cell includes a contiguous OD region that is configured to provide reverse bias to a P-N junction in the first memory array region and a different P-N junction in the second memory array region.

In some aspects, the techniques described herein relate to a computer system, wherein: the well pickup region has a width of about M*2-3 poly pitch, wherein M is a poly pitch width for an edge region with an n-well tap cell and a p-well tap cell for a memory array region that is not placed adjacent to another memory array region.

In some aspects, the techniques described herein relate to a computer system, wherein: a distance between an n-well in the first region and a different n-well in the second region has about a 3 poly pitch width.

In some aspects, the techniques described herein relate to a computer system, wherein: the middle region has about a 5 poly pitch width.

In some aspects, the techniques described herein relate to a computer system, wherein the processor is further configured to perform operations including placing a first tapless edge region along a first opposite edge of the first memory array region that is on a side opposite the first side of the first memory array region, wherein the first tapless edge region does not include an n-well tap cell or a p-well tap cell.

In some aspects, the techniques described herein relate to a computer system, wherein the processor is further configured to perform operations including placing a second tapless edge region along a second opposite edge of the second memory array region that is on a side opposite the second side of the second memory array region, wherein the second tapless edge region does not include an n-well tap cell or a p-well tap cell.

In some aspects, the techniques described herein relate to a computer system, wherein placing the first memory array region and placing the second memory array region includes inserting a plurality of static random access memory (SRAM) cells in the layout area.

In some aspects, the techniques described herein relate to a computer system, wherein inserting the plurality of SRAM cells in the layout area includes inserting a plurality of gate all-around field effect transistors in a 6 transistor SRAM circuit topology.

In some aspects, the techniques described herein relate to a semiconductor device including: a first memory array region with a first side; a second memory array region with a second side that faces the first side, wherein the first memory array region and the second memory array region include a plurality of SRAM cells; and a well pickup region disposed between the first memory array region along the first side and the second memory array region along the second side, the well pickup region having a first region with an n-well tap cell, a second region with an n-well tap cell, and a middle region with a p-well tap cell disposed between the first region and the second region, wherein a first edge region of the first region is placed along the first side of the first memory array region and a second edge region of the second region is placed along the second side of the second memory array region; wherein the p-well tap cell includes a contiguous OD region that is configured to provide reverse bias to a P-N junction in the first memory array region and a different P-N junction in the second memory array region.

In some aspects, the techniques described herein relate to a semiconductor device, wherein: a distance between an n-well in the first region and a different n-well in the second region has about a 3 poly pitch width; and the middle region has about a 5 poly pitch width.

In some aspects, the techniques described herein relate to a semiconductor device, further including: a first tapless edge region disposed along a first opposite edge of the first memory array region that is on a side opposite the first side of the first memory array region, wherein the first tapless edge region does not include an n-well tap cell or a p-well tap cell; and a second tapless edge region along a second opposite edge of the second memory array region that is on a side opposite the second side of the second memory array region, wherein the second tapless edge region does not include an n-well tap cell or a p-well tap cell.

In some aspects, the techniques described herein relate to a semiconductor device, wherein the plurality of SRAM cells include a plurality of gate all-around field effect transistors arranged in a 6 transistor SRAM circuit topology.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for memory cell placement, comprising:

placing a first memory array region with a first side in a layout area;

placing a second memory array region with a second side that faces the first side in the layout area;

placing a well pickup region between the first memory array region along the first side and the second memory array region along the second side, the well pickup region having a first region with an n-well tap cell, a second region with an n-well tap cell, and a middle region with a p-well tap cell disposed between the first region and the second region, wherein a first edge region of the first region is placed along the first side of the first memory array region and a second edge region of the second region is placed along the second side of the second memory array region; and fabricating an integrated circuit in accordance with the placing the first memory array region, the placing the second memory array region, and the placing the well pickup region;

wherein the well pickup region has a width of about M*2-3 poly pitch, wherein M is a poly pitch width for an edge region with an n-well tap cell and a p-well tap cell for a memory array region that is not placed adjacent to another memory array region; and wherein placing the first memory array region, placing the second memory array region, and placing the well pickup region are performed by one or more processors.

2. The method of claim 1, wherein:

the p-well tap cell comprises a contiguous OD region that is configured to provide reverse bias to a P-N junction in the first memory array region and a different P-N junction in the second memory array region.

3. The method of claim 1, wherein:

a distance between an n-well in the first region and a different n-well in the second region has about a 3 poly pitch width.

4. The method of claim 1, wherein:

the middle region has about a 5 poly pitch width.

5. The method of claim 1, further comprising:

placing a first tapless edge region along a first opposite edge of the first memory array region that is on a side opposite the first side of the first memory array region.

6. The method of claim 1, further comprising:

placing a second tapless edge region along a second opposite edge of the second memory array region that is on a side opposite the second side of the second memory array region.

7. The method of claim 1, wherein placing the first memory array region and placing the second memory array region comprises inserting a plurality of static random access memory (SRAM) cells in the layout area.

8. The method of claim 7, wherein inserting the plurality of SRAM cells in the layout area comprises inserting a plurality of gate all-around field effect transistors in a 6 transistor SRAM circuit topology.

9. A processor-implemented method comprising:

placing a first memory array region with a first side in a layout area;

placing a second memory array region with a second side that faces the first side in the layout area;

placing a well pickup region between the first memory array region along the first side and the second memory array region along the second side, the well pickup region having a first region with an n-well tap cell, a second region with an n-well tap cell, and a middle region with a p-well tap cell disposed between the first region and the second region, wherein a first edge region of the first region is placed along the first side of the first memory array region and a second edge region of the second region is placed along the second side of the second memory array region;

completing, for fabrication, a layout of an integrated circuit that includes the first memory array region, the second memory array region, and the well pickup region; and generating an IC design layout diagram of an integrated circuit from the layout that includes the first memory array region, the second memory array region, and the well pickup region;

wherein the p-well tap cell comprises a contiguous OD region that is configured to provide reverse bias to a P-N junction in the first memory array region and a different P-N junction in the second memory array region.

10. The method of claim 9, wherein:

the well pickup region has a width of about M*2-3 poly pitch, wherein M is a poly pitch width for an edge region with an n-well tap cell and a p-well tap cell for a memory array region that is not placed adjacent to another memory array region.

11. The method of claim 9, wherein:

a distance between an n-well in the first region and a different n-well in the second region has about a 3 poly pitch width.

12. The method of claim 9, wherein:

the middle region has about a 5 poly pitch width.

13. The method of claim 9, further comprising:

placing a first tapless edge region along a first opposite edge of the first memory array region that is on a side opposite the first side of the first memory array region.

14. The method of claim 9, further comprising:

placing a second tapless edge region along a second opposite edge of the second memory array region that is on a side opposite the second side of the second memory array region.

15. The method of claim 9, wherein placing the first memory array region and placing the second memory array region comprises inserting a plurality of static random access memory (SRAM) cells in the layout area.

16. The method of claim 15, wherein inserting the plurality of SRAM cells in the layout area comprises inserting a plurality of gate all-around field effect transistors in a 6 transistor SRAM circuit topology.

17. A method, comprising:

providing a first memory array region with a first side;

providing a second memory array region with a second side that faces the first side, wherein the first memory array region and the second memory array region comprise a plurality of SRAM cells; and providing a well pickup region disposed between the first memory array region along the first side and the second memory array region along the second side, the well pickup region having a first region with an n-well tap cell, a second region with an n-well tap cell, and a middle region with a p-well tap cell disposed between the first region and the second region, wherein a first edge region of the first region is placed along the first side of the first memory array region and a second edge region of the second region is placed along the second side of the second memory array region;

wherein the p-well tap cell comprises a contiguous OD region that is configured to provide reverse bias to a P-N junction in the first memory array region and a different P-N junction in the second memory array region.

18. The method of claim 17, wherein:

a distance between an n-well in the first region and a different n-well in the second region has about a 3 poly pitch width; and the middle region has about a 5 poly pitch width.

19. The method of claim 17, further comprising:

providing a first tapless edge region disposed along a first opposite edge of the first memory array region that is on a side opposite the first side of the first memory array region; and providing a second tapless edge region along a second opposite edge of the second memory array region that is on a side opposite the second side of the second memory array region.

20. The method of claim 17, wherein the plurality of SRAM cells comprise a plurality of gate all-around field effect transistors arranged in a 6 transistor SRAM circuit topology.

* * * * *